(12) United States Patent
Houle et al.

(10) Patent No.: US 8,168,109 B2
(45) Date of Patent: May 1, 2012

(54) STABILIZERS FOR VINYL ETHER RESIST FORMULATIONS FOR IMPRINT LITHOGRAPHY

(75) Inventors: Frances A. Houle, Fremont, CA (US);
Sally A. Swanson, San Jose, CA (US);
Taiichi Furukawa, Sunnyvale, CA (US)

(73) Assignees: International Business Machines Corporation, Armonk, NY (US); JSR Corporation (JP)

( * ) Notice: Subject to any disclaimer, the term of this patent is extended or adjusted under 35 U.S.C. 154(b) by 144 days.

(21) Appl. No.: 12/545,161

(22) Filed: Aug. 21, 2009

(65) Prior Publication Data
US 2011/0042862 A1    Feb. 24, 2011

(51) Int. Cl.
*B29C 35/08* (2006.01)
*B29C 59/02* (2006.01)
*G03F 7/004* (2006.01)

(52) U.S. Cl. ........ 264/320; 264/447; 264/494; 264/509; 522/77; 522/78; 522/79; 522/181; 430/281.1

(58) Field of Classification Search ........... 522/181, 522/172, 25, 29, 31, 66, 77, 78, 79; 430/281.1; 264/320, 447, 494, 509
See application file for complete search history.

(56) References Cited

U.S. PATENT DOCUMENTS

| | | | |
|---|---|---|---|
| 5,070,117 A | 12/1991 | Klemarczyk et al. | |
| 5,506,087 A | 4/1996 | Lapin et al. | |
| 5,648,194 A | 7/1997 | Pai et al. | |
| 5,650,261 A | 7/1997 | Winkle | |
| 6,416,928 B1 * | 7/2002 | Ohsawa et al. | 430/270.1 |
| 6,599,682 B2 * | 7/2003 | Iguchi et al. | 430/322 |
| 6,913,867 B2 | 7/2005 | Imai | |
| 7,306,853 B2 | 12/2007 | Lin et al. | |
| 7,326,510 B2 * | 2/2008 | Gogolides et al. | 430/270.1 |
| 7,358,028 B2 | 4/2008 | Maruyama et al. | |
| 7,393,624 B2 | 7/2008 | Allen et al. | |
| 7,419,611 B2 | 9/2008 | DiPietro et al. | |
| 7,488,771 B2 | 2/2009 | Houle et al. | |
| 2002/0013380 A1 | 1/2002 | Chappelow et al. | |
| 2004/0116545 A1 * | 6/2004 | Jakobstroer et al. | 516/115 |
| 2004/0116548 A1 | 6/2004 | Willson | |
| 2006/0052569 A1 * | 3/2006 | Lehmann et al. | 528/38 |
| 2007/0066750 A1 | 3/2007 | Houle et al. | |
| 2007/0117044 A1 * | 5/2007 | Ogihara et al. | 430/270.1 |
| 2007/0298176 A1 | 12/2007 | DiPietro et al. | |
| 2008/0174051 A1 | 7/2008 | DiPietro et al. | |
| 2008/0241418 A1 | 10/2008 | Allen et al. | |

OTHER PUBLICATIONS

International Search Report and Written Opinion for application No. PCT/EP2010/060719, filed Jul. 23, 2010; mailed Nov. 9, 2010, 13 pages.

(Continued)

*Primary Examiner* — Susan W Berman
(74) *Attorney, Agent, or Firm* — Cantor Colburn LLP

(57) ABSTRACT

Coating compositions suitable for UV imprint lithographic applications include at least one vinyl ether crosslinker having at least two vinyl ether groups; at least one diluent comprising a monofunctional vinyl ether compound; at least one photoacid generator soluble in a selected one or both of the at least one monofunctional vinyl ether compound and the at least one vinyl ether crosslinker having the at least two vinyl ether groups; and at least one stabilizer comprising an ester compound selectively substituted with a substituent at an ester position or an alpha and the ester positions. Also disclosed are imprint processes.

24 Claims, 2 Drawing Sheets

OTHER PUBLICATIONS

Ito, Hiroshi et al., "Vinyl ether resist system for UV-cured nanoimprint lithography", Proc. of SPIE, vol. 6153, (2006), pp. 1-11.

Kim, E.K., et al., "Vinyl ether formulations for step and flash imprint lithography", J. Vac. Sci. Technol. B23(6), Nov./Dec. 2005, 2005 American Vacuum Society, pp. 2967-2971.

Kim, E.K., et al., "Vinyl ethers in ultraviolet curable formulations for step and flash imprint lithography", J. Vac. sci. Technol. B22(a), Jan./Feb. 2004, 2004 American Vacuum Society, pp. 13-135.

Menger, Fredic M. et al., "A Non-Steroidal Facial Amphiphile", 2006 American Chemical Society, vol. 128, No. 15, dated Feb. 13, 2006, pp. 4960-4961.

* cited by examiner

STABILIZERS FOR VINYL ETHER RESIST FORMULATIONS FOR IMPRINT LITHOGRAPHY

BACKGROUND

This invention relates to stabilizers for vinyl ether resist formulations, and more particularly, to stabilizers for vinyl ether based coating compositions that are suitable for imprint lithography.

Imprint lithography has emerged in various forms as a potential alternative to conventional photolithography because of its ability to print smaller features at low cost. UV-cure nanoimprint lithography is a variant of imprint lithography that is amenable to the resolution and overlay requirements necessary for the fabrication of advanced semiconductor devices. In UV-cure nanoimprint lithography, a low-viscosity photosensitive molding material is molded between a mechanically rigid template having a relief pattern and a substrate, and then is exposed to actinic radiation. The resulting hardened layer, having a three dimensional pattern, can for example be used as an etch mask to transfer the imprinted pattern into the substrate below. Other applications are also possible.

Imprint lithography requires low volatility and low viscosity resists to obtain high quality patterned films with uniform composition within the minimum possible cycle time. The composition of the curable material is of critical importance because its components affect the degree of cure, adhesion to the template surface, adhesion to the bottom surface, cohesive strength of the cured material, and the dimensional stability of the imprinted features. Vinyl ether based resists are attractive chemical systems for this purpose because they have low volatility, low viscosity, and also because these materials have very rapid cure rates. Vinyl ether based resist formulations can be cationically cured upon exposure to actinic radiation and the cure chemistry is not affected by free radical traps such as oxygen, thereby reducing the sensitivity of the process to ambient air. Vinyl ether based resists are sensitive to ambient base, however, and their reactions can be inhibited by water vapor.

Prior art cationically curable vinyl ether based imprint resist systems typically contain a vinyl ether crosslinker, a photoacid generator (PAG), an optional reactive vinyl ether diluent, and a stabilizer additive (also commonly referred to a sensitizer additive).

The sensitizer/stabilizer additive, e.g., 9-anthracene methanol, phenothiazine, or coumarin 6, is typically added to inhibit acid induced polymerization reactions caused by degradation of the PAG in the absence of light. Unfortunately, currently available stabilizers such as those noted above are inadequate. For example, the 9-anthracenemethanol stabilizers are insoluble in many vinyl ethers, particularly, silicon-containing vinyl ethers. Also, shelf life is problematic for the 9-anthracenemethanol stabilizers since solidification can occur upon storage at low temperatures. With regard to phenothiazine, a violent reaction with certain kinds of PAG (e.g., 2-[2,2,3,3,4,4,4-heptafluoro-1-(nonafluorobutylsulfonyloxyimino)-butyl]-fluorene) has been observed to occur. Likewise, coumarin 6 has been observed to slow cationic polymerization, which is likely due to the basicity of coumarin 6.

Accordingly, there is a need in the art for improved stabilizers for vinyl ether resists.

SUMMARY

The shortcomings of the prior art are overcome and additional advantages are provided through the provision of a coating composition comprising at least one vinyl ether crosslinker having at least two vinyl ether groups; at least one diluent comprising a monofunctional vinyl ether compound; at least one photoacid generator soluble in a selected one or both of the i) monofunctional vinyl ether compound and ii) the at least one vinyl ether crosslinker; and at least one stabilizer comprising an ester compound selectively substituted with a substituent at either i) an ester position or ii) an alpha and the ester positions.

An imprint process comprises coating a substrate with an vinyl ether resist formulation comprising at least one vinyl ether crosslinker having at least two vinyl ether groups; at least one diluent comprising a monofunctional vinyl ether compound; at least one photoacid generator soluble in a selected one or both of the i) monofunctional vinyl ether compound and ii) the at least one vinyl ether crosslinker; and at least one stabilizer comprising an ester compound selectively substituted with a substituent at either i) an ester position or ii) an alpha and the ester positions; pressing a template having a relief image onto the vinyl ether resist formulation; photocationically curing the vinyl ether resist formulation to form a solidified reverse image replica of the relief pattern in the template; and releasing the template from the cured organic vinyl ether resist formulation.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
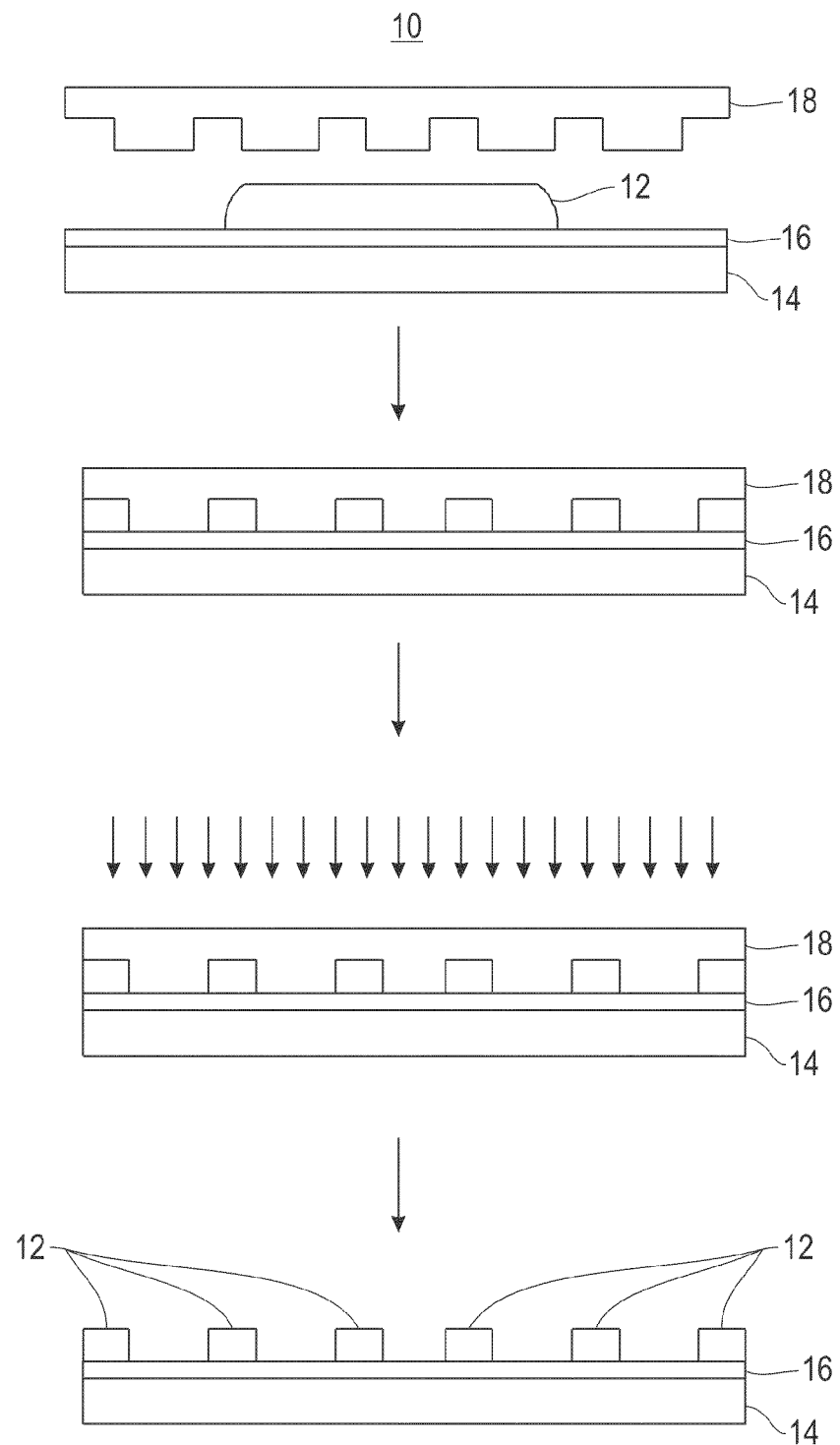
FIG. 1 illustrates an exemplary imprint lithography process.

The detailed description explains the preferred embodiments of the invention, together with advantages and features, by way of example with reference to the drawings.

DETAILED DESCRIPTION

Disclosed herein are vinyl ether based resist formulations suitable for nanoimprint applications that provide improved stabilization, overcoming the problems noted in the prior art. The vinyl ether resist coating compositions generally include at least one vinyl ether crosslinker; at least one diluent comprising a monofunctional vinyl ether compound; and at least one substituted ester stabilizer. In one embodiment, the coating compositions have a viscosity of less than or equal to 100 centipoise at 295 Kelvin.

The substituted ester stabilizer has substituents at the alpha and/or ester positions to provide increased solubility and low volatility. In one embodiment, the substituted ester stabilizer is of the following formula (I).

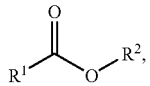
(I)

wherein $R^1$ (i.e., substitution at the alpha position) is independently selected from the group consisting of a hydrocarbyl substituent, the hydrocarbyl substituent selected from the group consisting of a linear alkyl group, a branched alkyl, a cycloalkyl group, a bicycloalkyl group, a fluorinated linear alkyl group, a fluorinated branched alkyl group, a fluorinated cycloalkyl group, an aryl group, an aralkyl group, an alkaryl group, an alkenyl group, a cyclo alkenyl group, a dihydropyranyl group, a dihydrofuranyl group, an alkalkenyl group, an alkenylalkyl group, an alkynyl group, an alkalkynyl group, an alkynylalkyl group, a trifluormethyl group, a trifluoroethyl group, a trifluoropropyl group, a cyanopropyl group, a tristrialkysilyl group, a tris-triarylsilyl group, a tris-trialkarylsilyl group, a tris-triarakylsilyl group, a tris-triakenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group; and $R^2$ (i.e., substitution at the ester position) is selected from the group consisting of a hydrocarbyl substituent selected from the group consisting of a linear alkyl, a linear alkoxy group, a linear alkoxycarbonylmethyl group, a branched alkyl, a branched alkoxy group, a branched alkoxycarbonylmethyl group, a cycloalkyl group, a cycloalkoxy or a bicycloalkoxy group, a fluorinated linear alkyl group, a fluorinated branched alkyl group, a fluorinated cycloalkyl group, an aryl group, an aralkyl group, an alkaryl group, an alkenyl group, a cyclo alkenyl group, a dihydropyranyl group, a dihydrofuranyl group, an alkalkenyl group, an alkenylalkyl group, an alkynyl group, an alkalkynyl group, an alkynylalkyl group, a trifluormethyl group, a trifluoroethyl group, a trifluoropropyl group, a cyanopropyl group, a tristrialkysilyl group, a tris-triarylsilyl group, a tris-trialkarylsilyl group, a tris-triarakylsilyl group, a tris-triakenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group.

Exemplary substituted ester stabilizers include, without limitation, anthracenecarboxylic acid methyl ester; anthracenecarboxylic acid isopropyl ester; anthracenecarboxylic acid butyl ester; anthracenecarboxylic acid isopropoxycarbonylmethyl ester; anthracenecarboxylic acid methoxycarbonylmethyl ester; anthracenecarboxylic acid tert-butoxycarbonylmethyl ester; ethyl acetate; isopropyl acetate; tert-butyl acetate; benzoic acid methyl ester; benzoic acid isopropyl ester; benzoic acid tert-butyl ester; combinations thereof, and the like. The stabilizer is less than 15% by weight of the photoacid generator.

The at least one monofunctional vinyl ether diluent, wherein the least one mono functional vinyl ether diluent has a single vinyl ether group has a single vinyl ether group ($CR_2$=CRO—), may be represented by the following structure (II):

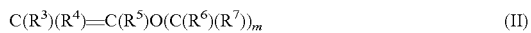
(II)

In one embodiment, the at least one monofunctional vinyl ether diluent is free from a silicon and a fluorine substituent.

The resist composition also includes at least one vinyl ether compound having at least two vinyl ether groups, wherein the multifunctional vinyl ether may be represented by the following structures (III-V):

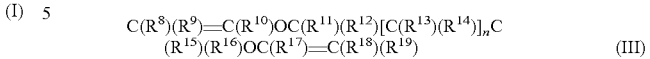
(III)

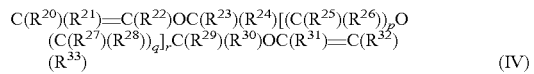
(IV)

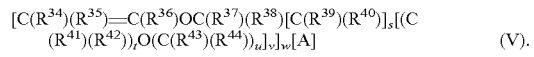
(V).

In formulas (II)-(V), each m is represented by an integer from 1 to 20, wherein "m" can be arranged in a linear chain or in a cyclic or polycyclic structure. Each n is represented by an integer from 1 to 10, and it is understood that for each of the $C(R^{13})(R^{14})$ groups represented by n, the $R^{13}$ and $R^{14}$ groups are independently selected at each occurrence and are not necessarily the same. The carbon backbone (n C) can be arranged in a linear chain or in a cyclic or polycyclic structure. Each p is represented by an integer from 1 to 10, and it is understood that for each of the $C(R^{25})(R^{26})$ groups represented by p, the $R^{25}$ and $R^{26}$ groups are independently selected at each occurrence and are not necessarily the same. The carbon backbone (p C) can be arranged in a linear chain or in a cyclic or polycyclic structure. Each q is represented by an integer from 1 to 10, and it is understood that for each of the $C(R^{27})(R^{28})$ groups represented by q, the $R^{27}$ and $R^{28}$ groups are independently selected at each occurrence and are not necessarily the same. The carbon backbone (q C) can be arranged in a linear chain or in a cyclic or polycyclic structure. Each r is represented by an integer from 1 to 10. Each s is represented by an integer from 0 to 10, and it is understood that for each of the $C(R^{39})(R^{40})$ groups represented by s, the $R^{39}$ and $R^{40}$ are independently selected at each occurrence and are not necessarily the same. The carbon backbone (s C) can be arranged in a linear chain or in a cyclic or polycyclic structure. Each t is represented by an integer from 1 to 10, and it is understood that for each of the $C(R^{41})(R^{42})$ groups represented by t, the $R^{41}$ and $R^{42}$ groups are independently selected at each occurrence and are not necessarily the same. The carbon backbone (t C) can be arranged in a linear chain or in a cyclic or polycyclic structure. Each u is represented by an integer from 1 to 10, and it is understood that for each of the $C(R^{43})(R^{44})$ groups represented by u, the $R^{43}$ and $R^{44}$ groups are independently selected at each occurrence and are not necessarily the same. The carbon backbone (u C) can be arranged in a linear chain or in a cyclic or polycyclic structure. Each v is represented by an integer from 0 to 10. Each w is represented by integers from 2 to 6.

Each $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$, $R^{38}$, $R^{39}$, $R^{40}$, $R^{41}$, $R^{42}$, $R^{43}$, and $R^{44}$ ($R^3$-$R^{44}$) may be independently at each occurrence a hydrogen atom or a hydrocarbyl substituent with a primary, a secondary or a tertiary carbon attachment point. The A group is an aromatic group.

In formulas (II-V), the hydrocarbyl substituent may be selected from the group consisting of a linear alkyl or a linear alkoxy group having 1-6 carbon atoms, a branched alkyl or branched alkoxy group having 2-12 carbon atoms, a cycloalkyl, a bicycloalkyl, a cycloalkoxy or a bicycloalkoxy group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, and a cyanopropyl group. In addition, the hydrocarbyl group may be linked with other R groups to form a carbon ring having 3 to 8 carbon atoms. The hydrocarbyl substituent may also be selected from the vinyl ether groups $C(R^{45})(R^{46})=C(R^{47})OC(R^{48})(R^{49})[C(R^{50})(R^{51})]_n$ and $C(R^{52})(R^{53})=C(R^{54})OC(R^{55})(R^{56})[C_p(R^{57})(R^{58})OC_q(R^{59})(R^{60})]_r$, wherein each $R^{45}$, $R^{46}$, $R^{47}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, $R^{60}$ ($R^{45}$-$R^{60}$) may be independently at each occurrence a hydrogen atom or a hydrocarbyl substituent with a primary, a secondary or a tertiary carbon attachment point, and wherein r and n are as described above. Preferably, the vinyl ether crosslinker is free from a silicon and a fluorine substituent.

The vinyl ether resist composition further includes a radiation sensitive photoacid generator (PAG). These PAGs are compounds that generate an acid upon exposure to actinic radiation. In various embodiments, any suitable photoacid generating agent may be used including ionic and nonionic PAGs, so long as the selected photoacid generator dissolves sufficiently in the coating composition, and the resulting solution thereof may form a coating on a substrate by a dispensing process, or spin coating, or the like. As is well known to those skilled in the art after reading the present application, the following illustrative classes of photoacid generators may be employed in various embodiments of the present invention.

Typical photoacid generators include, without limitation: (1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenyl-sulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride; (2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)-iodonium triflate, and bis-(t-butylphenyl)-iodonium camphanylsulfonate; (3) α, α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane; (4) trifluoromethanesulfonate esters of imides and hydroxyimides, e.g., α-(trifluoromethylsulfonyloxy)-bicyclo[2.2.1]hept-5-ene-2,3-dicarboximide (MDT); (5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate; (6) sulfonyloxynaphthalimides such as N-camphorsulfonyloxynaphthalimide and N-pentafluorophenylsulfonyloxynaphthalimide; (7) pyrogallol derivatives (e.g., trimesylate of pyrogallol); (8) naphthoquinone-4-diazides; (9) alkyl disulfones; (10) s-triazine derivatives; and (11) miscellaneous sulfonic acid generators including t-butylphenyl-α-(ptoluenesulfonyloxy)-acetate, t-butyl-α-(p-toluenesulfonyloxy) acetate, and N-hydroxynaphthalimide dodecane sulfonate (DDSN), and benzoin tosylate.

Additional suitable photoacid generators useful in conjunction with the coating compositions and methods provided herein will be known to those skilled in the art.

By way of example, the PAG of the coating composition may include at least one of the following structures (VI-VIII):

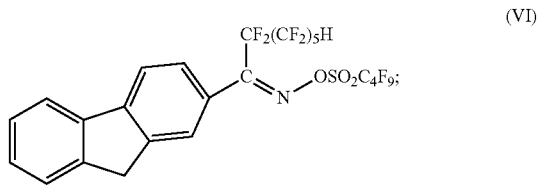
(VI)

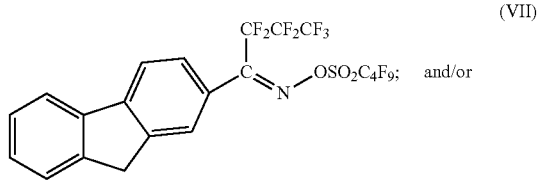
(VII) and/or

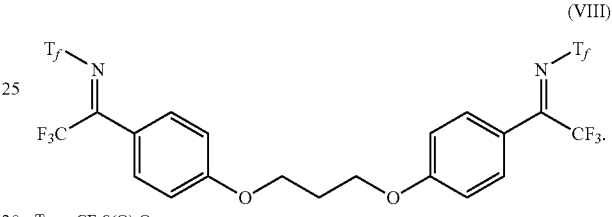
(VIII)

$T_f = CF_3S(O)_2O-$

The ratio of the vinyl ether crosslinker to diluent is approximately 3:7 to 9.5:0.5. In other embodiments, the ratio of vinyl ether crosslinker to diluent is approximately 5:5 to 9.5:0.5; and in still other embodiments, the ratio of vinyl ether crosslinker to diluent is approximately 7:3 to 9.5:0.5.

The photoacid generator approximately is 0.1 to 5 wt % of the total weight of the crosslinker and diluent components; and in other embodiments, the photoacid generator is approximately 0.2 to 3 wt % of the total weight of the crosslinker and diluent components.

The stabilizer is approximately 0.1 to 5 wt % of the total weight of the vinyl ether crosslinker and diluent components; and in other embodiments, the stabilizer is approximately 0.2 to 3 wt % of the total weight of the vinyl ether crosslinker and diluent components.

In one embodiment, the total crosslinker in the composition is 28.2 to 29.9 wt %, wherein the diluent is 66.0 to 69.9 wt %, and the stabilizer including the photoacid generator is 0.2 to 5.8 wt %. In another embodiment, the total crosslinker in the composition is 47.0 to 49.9 wherein the diluent is 47.0 to 49.9 wt %, and the stabilizer including the photoacid generator is 0.2 to 6.0 wt %. In still another embodiment, the total crosslinker in the composition is 66.0 to 69.9, wherein the diluent is 28.2 to 29.9 wt %, and the stabilizer including the photoacid generator is 0.2 to 5.8 wt %.

FIG. 1 illustrates an exemplary imprint process 10 for which the vinyl ether resist formulations can be utilized. The process first includes applying the vinyl ether resist formulation 12 in accordance with the present invention onto a base substrate 14. The base substrate 14 may first be coated with an adhesion promoter 16. A template 18 with nanostructures on its surface and the base substrate 14 are then aligned and the gap between them decreased such that the template 18 is pressed into the applied resist 12. The template can include a release layer (not shown). The vinyl ether resist 12 is then illuminated through the backside of the template 18 with activating radiation 20 to photocationically cure the vinyl ether resist 12. The template 18 is then withdrawn leaving the now cured and imprinted medium with relatively low aspect ratio, high-resolution features representing a solidified reverse image replica of the relief pattern in the template. In practice, a thin uniform residual layer of cured photoresist (not shown) may remain between layer 16 and the imprinted features. The cured and imprinted medium is then etched to form high aspect ratio high resolution features in the base substrate.

The following examples are presented for illustrative purposes only, and are not intended to limit the scope of the invention.

EXAMPLES

In the following examples, cyclohexyl vinyl ether (CHVE), 2-ethylhexyl vinyl ether (EHVE), diethyleneglycol divinyl ether (DGDVE) and 9-anthracenemethanol (9-AM) were obtained from Aldrich Chemical Company. 1,4-butanediol divinyl ether (BDVE), trimethyleneglycol trivinyl ether (TMPVE), cyclohexanedimethanol divinyl ether (CHDVE) and nonanediol divinyl ether (NDVE) were obtained from Nippon Carbide Industries, Co. Inc.

1,3-benzenedimethyl divinyl ether (BDMDVE) was synthesized from 1,3-benzenedimethanol, which was prepared in a two-liter, 3-necked round-bottomed flask equipped with a 500-ml constant pressure addition funnel, an overhead stirrer, a thermocouple and a nitrogen inlet into which was added 27 g (0.74 mol) of lithium aluminum hydride (95%) and 1000 ml of anhydrous tetrahydrofuran (THF). The addition funnel was charged with a solution of 100 g (0.493 mol) of isophthaloyl dichloride in 400 ml of anhydrous THF. Diacylchloride was added slowly over a period of 2 hours with cooling in an ice bath. Once addition was complete the ice bath was removed and the suspension allowed to reach room temperature for four hours at which time it was re-cooled and 200 ml of ethyl acetate was slowly added to decompose the remaining hydride. The addition funnel was recharged with 200 ml of 2M NaOH, which was then added slowly with vigorous stirring until the ensuing suspension became granular in appearance. The suspension was filtered and well washed with ethyl acetate. The combined filtrate and washings were then washed with brine, dried over anhydrous magnesium sulfate and evaporated on a rotary evaporator to yield 64 g (94%) of 1,3-benzenedimethanol as a clear, colorless oil which solidified upon standing. The BDMDVE was then prepared in a two-liter round bottomed flask equipped with a positive-pressure nitrogen inlet and a magnetic stir bar was added 64 g (0.46 mol) of 1,3-benzenedimethanol, 10 g (0.03 mol) of mercuric acetate and 1 liter of ethyl vinyl ether. The solution was stirred at room temperature for four days at which time it was washed well with saturated sodium bicarbonate solution and brine. The solution was then stirred for three days over 20 g of anhydrous magnesium sulfate (the reaction is driven to completion by stirring over the acidic magnesium sulfate), filtered, and evaporated on a rotary evaporator. The resulting oil was distilled twice through an 8" Vigreux to yield 53 g (60%) of BDMDVE, boiling point=84° C. at 1 mm Hg.

Trimethylsilylmethyl vinyl ether (TMSVE) was synthesized in a 500-mL 3-necked round bottomed flask equipped with a magnetic stir bar, thermocouple and nitrogen inlet into which was added 19.3 g (0.185 mol) of trimethylsilylmethanol, 300 mL of ethyl vinyl ether and 2.25 g (0.007 mol) of mercuric acetate. The solution was stirred under nitrogen at room temperature for 48 hr at which time it was thoroughly washed with saturated sodium bicarbonate, water and brine. The organic layer was dried for 1 hr over anhydrous magnesium sulfate and filtered. The filtrate was distilled from solid sodium carbonate through an 8" Vigreux at atmospheric pressure to remove the ethyl vinyl ether followed by vacuum distillation at 26 mmHg. The product distilled at 51° C., yield 18.3 g (76%).

2-[(Tris-trimethylsilyl)silyl]ethyl vinyl ether (TMS3SiVE) was synthesized from (tris-trimethylsilyl)silyl] ethanol, which was prepared in a 1 L, four-necked found-bottomed flask equipped with an ice bath, an overhead stirrer, a thermowell and a 125 mL constant-pressure addition funnel with a nitrogen inlet. To the flask, Lithium aluminum hydride (95%, 7.6 g, 0.19 mol) and anhydrous ether (800 mL) was added to the flask under a nitrogen blanket. The addition funnel was charged with of (tris-trimethylsilyl)silylethyl acetate (62.0 g, 0.185 mol). The flask was cooled to 5° C. and the silyl acetate was added slowly, maintaining a temperature of <10° C. The suspension was allowed to reach room temperature and stirred overnight. The mixture was then recooled and water was added slowly dropwise with vigorous stirring until a heavy, granular solid was obtained. The solid was filtered off, washed well with ether and the washings, combined with the filtrate, and evaporated on a rotary evaporator. The white solid thus obtained was evaporated with four additional volumes of ether after which it was taken up in 500 mL of ether and washed with 3×500 mL of water. The ether solution was dried over MgSO4, filtered, evaporated on a rotary evaporator and dried in a 40° C. vacuum oven with a nitrogen bleed to yield 52.5 g (97%) of a white, waxy solid. The (tris-trimethylsilyl)silylethyl acetate was prepared in a 1 L, four-necked round-bottomed flask equipped with a thermocouple-controlled heating mantle, an overhead stirrer, a thermowell, a reflux condenser with a nitrogen inlet and a 125 mL constant-pressure addition funnel. Heptane (600 mL), vinyl acetate (17.5 g, 0.202 mol), and of $H_2PtCl_6$ catalyst (40 mg) was added to the flask. The addition funnel was charged with 60 g (74.6 mL, 0.24 mol) of (tris-trimethylsilyl)silane via a syringe. The silane was added in a thin stream while the flask was slowly heated to 90° C. with stirring. The reaction was maintained at 90° C. for two days after which time the mixture was filtered through a plug of Celite and evaporated on a rotary evaporator. The yellow residue was distilled twice through a 12" Vigreux to yield 62.0 g (91%) of a clear, viscous liquid, bp 95-98° C.@1 mmHg. The TMS3SiVE was then prepared in a 250 mL 3-necked round bottomed flask equipped with a magnetic stir bar, thermowell and nitrogen inlet. 2-[(Tris-trimethylsilyl)silyl]ethanol (5.0 g, 0.0017 mol) ethyl vinyl ether (75 mL) and mercuric acetate (0.18 g, 0.56 mmol) was added to the flask. The solution was stirred under nitrogen at room temperature for 48 hr at which time it was thoroughly washed with saturated sodium bicarbonate, water, and brine. The organic layer was dried for 1 hr over anhydrous $MgSO_4$ and filtered. The filtrate was evaporated on a rotary evaporator and distilled (bp 94° C.@0.5 Torr) from solid sodium carbonate to yield 5.1 g (94%).

Dimethyldivinyloxymethylsilane (DDMSi) was synthesized from dimehyldihydroxymethylsilane, which was prepared in a 3 L, 3-necked round bottomed flask equipped with a thermowell, an overhead stirrer and a reflux condenser. Dimethyldiacetoxymethylsilane (121 g, 0.6 mol), methanol (2.2 L) and of conc. HCl (6 mL) was added to the flask and the solution refluxed overnight with stirring. The solution was cooled and solid sodium bicarbonate (10 g) was added. The mixture was stirred for an additional 3 hours at which time the solvent was removed on a rotary evaporator. The resulting residue was taken up in 500 mL of water and washed once with 500 mL of hexane. The aqueous layer was then saturated with sodium chloride and extracted three times with 500 mL portions of ethyl acetate. After drying over MgSO$_4$ for 2 hours, the solvent was removed on a rotary evaporator and the product distilled (bp 62° C.@1 Torr) to yield 53 g (74%) as a clear, colorless, viscous liquid. The dimethyldiacetoxymethylsilane was prepared in a 1 L, 3-necked round bottomed flask equipped with an overhead stirrer, thermowell and a reflux condenser. was added) of Dimethyldichloromethylsilane (100 g, 0.64 mol), potassium acetate (158 g, 1.6 mol) and glacial acetic acid (150 mL) were added to the flask and the mixture refluxed with stirring overnight. The cooled suspension was carefully added to saturated sodium bicarbonate solution (2 L) with vigorous stirring. The resulting mixture was extracted four times with 500 mL portions of diethylether and the combined organics were washed with water and brine. After drying for 2 hr over anhydrous MgSO$_4$, the solvent was removed to yield 122 g (95%) as a clear, colorless liquid. The DDMSi was then prepared in a 2 L, 3-necked round bottomed flask equipped with a magnetic stir bar, thermowell and a nitrogen inlet. of dimethyldihydroxymethylsilane (43 g, 0.36 mol), ethyl vinyl ether (1500 mL), mercuric acetate (7.6 g, 0.0025 mol) and of triethylamine (4.8 g, 0.047 mol) were added to the flask. The solution was stirred under nitrogen at room temperature for 48 hr at which time it was thoroughly washed with saturated sodium bicarbonate, water and brine. The organic layer was dried overnight over anhydrous MgSO$_4$ and filtered. The filtrate was distilled twice from solid sodium carbonate through a 12" Vigreux (bp 65° C.@1 Torr) to yield 30 g (58%) as a clear, colorless liquid. Approximately 18 g of the cyclic acetal was also isolated.

Ethyl acetate, isopropyl acetate, tert-butyl acetate, benzoic acid methyl ester, benzoic acid isopropyl ester, benzoic acid tert-butyl ester were obtained from TCI America.

The chemical structures of the various organic and silicon containing vinyl ether compounds utilized in the resists were as follows.

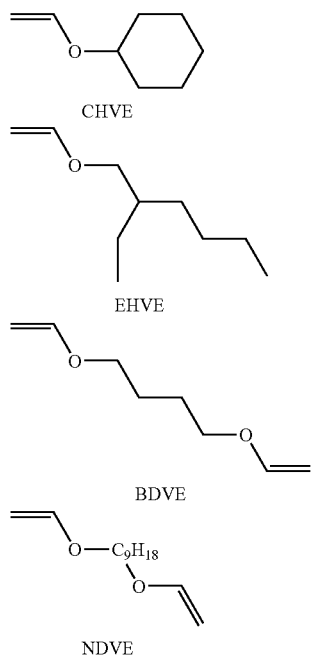

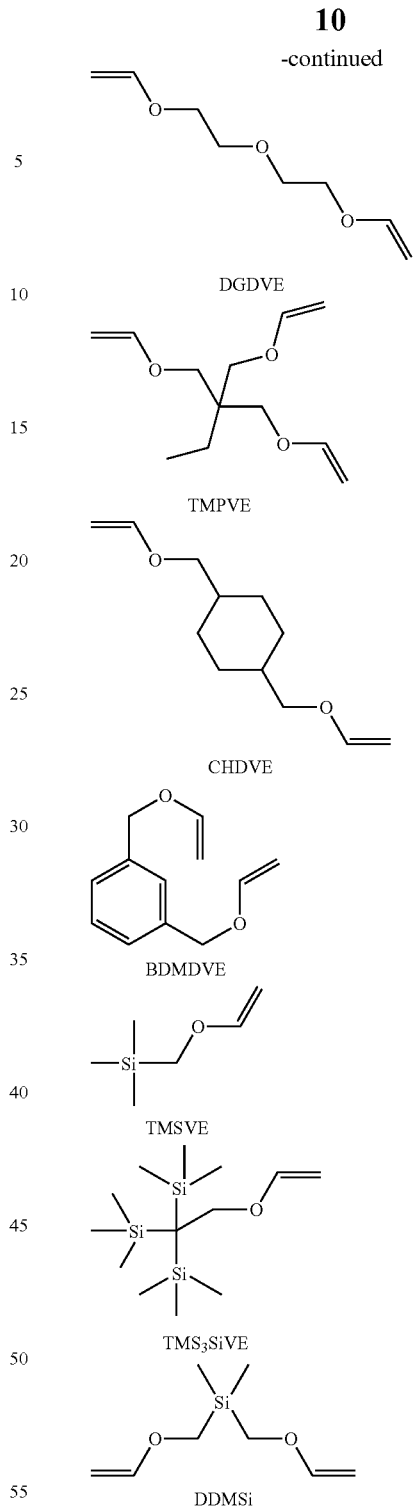

The remaining components were synthesized as detailed below.

Example 1

In this example, anthracenecarboxylic acid methyl ester was synthesized as described in Menger, F. M. and Sorrells, J. L., *J. Am. Chem. Soc.* 2006, 128, 4960-4961 in 89% yield. 1HNMR (CDCL$_3$): 8.76 (s, 1H), 8.05 (m, 4H), 7.56 (m, 4H), 4.21 (s, 3H).

Example 2

In this example, anthracenecarboxylic acid isopropyl ester was synthesized. 9-Anthracenecarboxylic acid (2.22 g, 10 mmol) and trifluoroacetic acid (3.7 mL, 25.97 mmol) were stirred in 25 mL toluene for 80 minutes. Isopropanol (2.1 mL, 27 mmol) was added and the solution was stirred at room temperature overnight. The solution was then extracted with saturated $NaHCO_3$ (33 mL×3), dried over magnesium sulfate and rotary evaporated to dryness. The yield was 2.5 g gold crystals (95%). 1HNMR ($CDCL_3$): 8.54 (s, 1H), 8.06 (m, 4H), 7.56 (m, 4H), 5.66 (m, 1H), 1.56 (d, 6H).

Example 3

In this example, anthracenecarboxylic acid tert-butyl ester was synthesized. 9-Anthracenecarboxylic acid (1.11 g, 5 mmol) and trifluoroacetic acid (1.84 mL, 13 mmol) were stirred in 12.5 mL toluene for 60 minutes. t-Butanol (1.0 g, 13.5 mmol) was added and the solution was stirred at room temperature overnight. The solution was then extracted with saturated $NaHCO_3$ (15 mL×3), dried over magnesium sulfate and rotary evaporated to dryness. The yield was 0.21 g crystals (15%). 1HNMR ($CDCL_3$): 8.51 (s, 1H), 8.05 (dd, 4H), 7.55 (m, 4H), 1.81 (s, 9H).

Example 4

In this example, anthracenecarboxylic acid isopropoxycarbonylmethyl ester was synthesized. Isopropylglycolate prepared as described by Tays, K. and Atkinson, J. K., *Synthetic Communications*, 1998 28(5), 903-912. Glycolic acid (19.66 g, 258.5 mmol) was dissolved in 150 mL of i-propanol containing 0.22 g (1.14 mmol) p-toluenesulfonic acid. The solution was taken to reflux overnight using a Soxhlet extractor containing 4 angstrom molecular sieves. After cooling to room temperature, reaction was poured into 10% aqueous sodium carbonate, the excess IPA was removed on the rotary evaporator and the product was extracted into methylene chloride (3×), dried over magnesium sulfate, filtered and rotary evaporated to dryness. The yield of isopropylglycolate was 9.07 g (30%). 1HNMR ($CDCL_3$): 5.12 (m, 1H), 4.12 (d, 2H), 2.48 (m, 1H), 1.30 (d, 6H).

9-Anthracencarboxylic acid (1.11 g, 5 mmol, 1 equiv), trifluoroacetic anhydride (1.84 mL, 13 mmol, 2.6 equiv) and 12.5 mL toluene were placed in a flask and stirred for 1 hour to dissolve. Isopropylglycolate (1.54 g, 13 mmol, 2.6 equiv) was added to the reaction and stirred overnight. The solution was then washed with (15 mL×3) portions of saturated $NaHCO_3$ solution. The organic layer was dried over magnesium sulfate, filtered and rotary evaporated to dryness and then dried overnight in a 60° C. vacuum oven. This yielded 1.45 g of 2-isopropoxy-2-oxoethyl anthracene-9-carboxylate, yield 90%. 1HNMR ($CDCL_3$): 8.59 (s, 1H), 8.36 (d, 2H), 8.05 (d, 2H), 7.60 (m, 4H), 5.29 (m, 1H), 5.07 (s, 2H) 1.40 (d, 6H).

Example 5

In this example, anthracenecarboxylic acid methoxycarbonylmethyl ester was synthesized. 9-Anthracencarboxylic acid (1.11 g, 5 mmol, 1 equiv) trifluoroacetic anhydride (1.84 mL, 13 mmol, 2.6 equiv) and 12.4 mL toluene were placed in a flask and stirred for 1 hour to dissolve. Methylglycolate (1.04 mL, 13.5 mmol, 2.7 equiv) was added to the reaction and stirred overnight. The solution was then washed with (15 mL×3) portions of saturated NaHCO3 solution. The organic layer was dried over magnesium sulfate, filtered and rotary evaporated to dryness and then dried overnight in a 60° C. vacuum oven. This yielded 1.27 g of pale tan crystals, yield 87%. 1HNMR ($CDCL_3$): 8.59 (s, 1H), 8.34 (d, 2H), 8.05 (d, 2H), 7.60 (m, 4H), 5.31 (m, 1H), 3.94 (s, 3H) 1.58 (s, 6H).

Example 6

In this example, anthracenecarboxylic acid tert-butoxycarbonylmethyl ester was synthesized. 9-anthracenecarboxylic acid (10.0 g), potassium tert-butoxide (5.5 g) and anhydrous dimethylformiamide were placed in a flask and stirred for 1 hour to dissolve. tert-butyl bromoacetate (10.0 g) was added to the reaction and stirred for 2 hours at 23° C. Ethyl acetate (20.0 g) was poured into the solution. The solution was then washed with water. The organic layer was rotary evaporated to dryness and dried overnight in a 60° C. vacuum oven. This yielded 11.2 g.

Example 7

Figure 2:
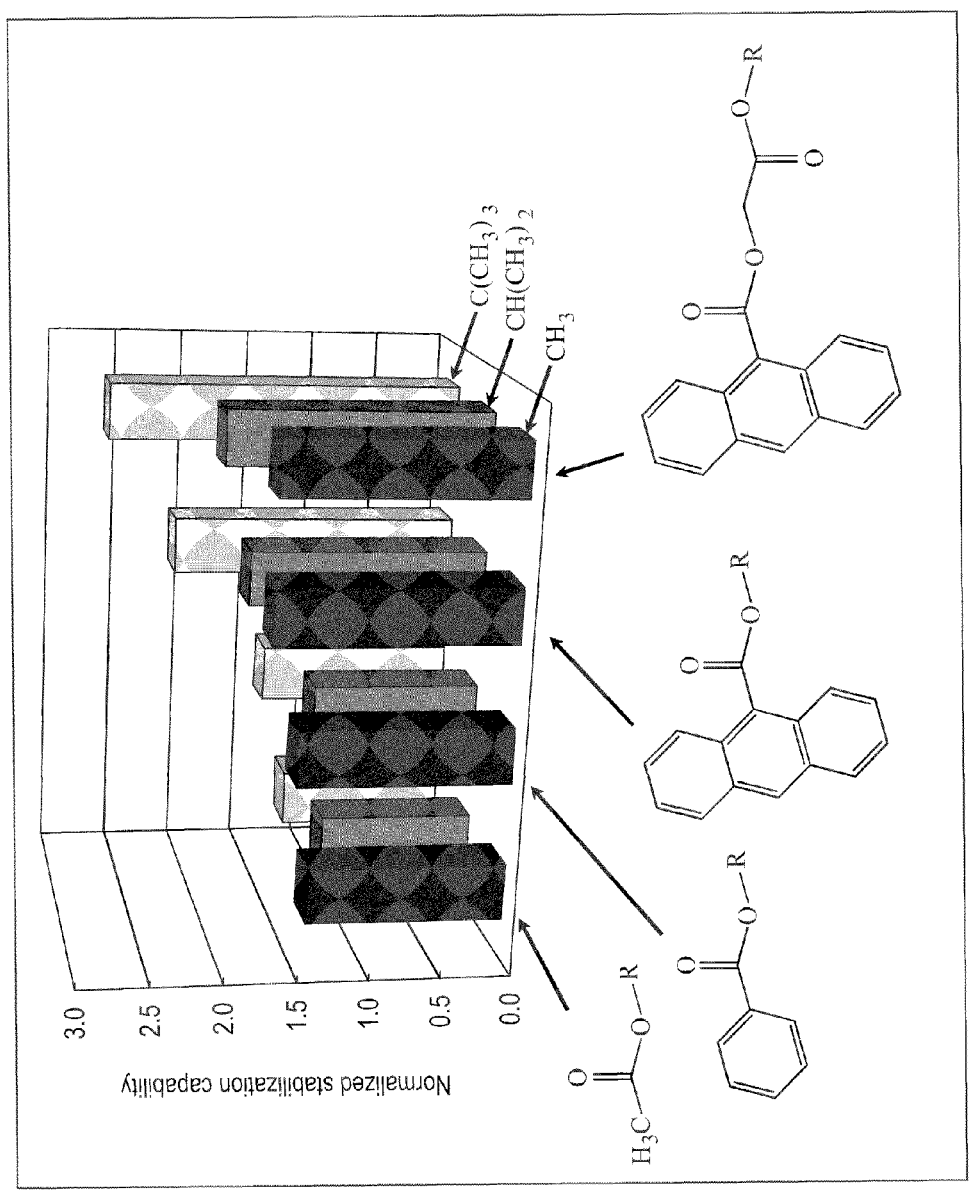
FIG. 2 graphically illustrates normalized stabilizer efficiency as a function of substituent on an ester based stabilizer in accordance with the present invention.

In this example, vinyl ether photocurable resist formulations were prepared to evaluate the efficiency of various stabilizers. The resists were comprised of diethylene glycol divinyl ether (DGDVE) with 2-[2,2,3,3,4,4,4-heptafluoro-1-(nonafluorobutylsulfonyloxyimino)-butyl]-fluorene, commercially available under the trade name CGI 1906 from Ciba Specialty Chemicals, (concentration of 74 mmol/L) and a stabilizer concentration of 36 mmol/L. By way of example, a test formulation for anthracenecarboxylic acid t-butoxycarbonylmethyl ester (9-ABM) was prepared by dissolving 12.40 mg (0.74 mmol) CGI 1906 and 2.76 mg (0.36 mmol) of the ester in 0.25 mL diethylene glycol divinyl ether. Accelerated aging tests were performed by storing the resists at 40° C. and monitoring the amount of time to solidification. Shelf life improvement relative to a resist formulation that did not include a stabilizer is provided as well as a comparison with a typical prior art stabilizer, 9 anthracenemethanol. The results are given in Table 1 and FIG. 2.

TABLE 1

| Stabilizer | Boiling Point (° C.) | Aging at 40° C. Solidification Time (approximate hours) | Shelf Life Improvement relative to Control (%) |
|---|---|---|---|
| *Control: no stabilizer | — | 57 | — |
| *Control: 9-Anthracenemethanol (prior art) | Solid | 63 | 10 |
| Ethyl acetate | 57 | 80 | 40 |
| Isopropyl acetate | 85 | 63 | 10 |
| tert-Butyl acetate | 97 | 68 | 20 |
| Benzoic acid methyl ester | 200 | 86 | 50 |
| Benzoic acid isopropyl ester | 218 | 68 | 20 |
| Benzoic acid tert-butyl ester | N/A | 80 | 40 |
| Anthracenecarboxylic acid methyl ester | Solid | 98 | 70 |
| Anthracenecarboxylic acid isopropyl ester | Solid | 98 | 70 |
| Anthracenecarboxylic acid tert-butyl ester | Solid | 122 | 110 |
| Anthracenecarboxylic acid-methoxycarbonyl methyl ester | Solid | 98 | 70 |
| Anthracenecarboxylic acid-isopropoxycarbonyl methyl ester | Solid | 107 | 90 |
| Anthracenecarboxylic acid-tert-butoxycarbonyl methyl ester | Solid | 146 | 160 |

*Comparative examples

The results show that the substituted ester stabilizers are at least as effective as 9-anthracenemethanol (9-AM), which provided a 10% shelf life improvement relative to the vinyl ether resist formulation without any stabilizer. Of the substituted esters tested, anthracenecarboxylic acid-tert-butoxycarbonyl methyl ester (9-ABM), provided a 160% shelf-life improvement relative to the same resist formulation without any stabilizer. Relative to the prior art 9-AM, 9-ABM substituted ester exhibited an increase in shelf life improvement of more than 130%. Because the accelerated aging study was at 40° C., the effectiveness at room temperature and below is expected to be significantly greater. Although all of the esters tested were effective for stabilization, the acetates, while they may be suitable for some applications, are generally less desirable because they are relatively volatile and may exhibit some evaporation from the formulation during storage.

Example 8

In this example, stabilizer solubility of 9-anthracenecarboxylic acid-tert-butoxycarbonyl methyl ester (9-ABM) was compared to the solubility of 9-anthracenemethanol (9-AM) in various organic and silicon containing vinyl ethers. The results and concentrations evaluated are shown in Tables 2 and 3.

TABLE 2

| Additive | Reactive Diluent | | Difunctional vinyl ether crosslinker | | | | | |
|---|---|---|---|---|---|---|---|---|
| | CHVE | EHVE | DGDVE | BDVE | NDVE | CHDVE | BDMDVE | TMPVE |
| 9-AntMeOH[1] | Δ | X | ○ | Δ | Δ | Δ | Δ | Δ |
| 9-AntMeOH[2] | X | X | ○ | X | X | X | X | X |
| 9-ABM[2] | ○ | ○ | ○ | ○ | ○ | ○ | ○ | ○ |

[1]refers to an additive concentration of 0.7 weight percent
[2]refers to an additive concentration of 1.4 weight percent
○—soluble at room temperature (about 23° C.)
Δ—soluble at 50° C.
X—insoluble

TABLE 3

| | Reactive Diluent | | Difunctional vinyl ether crosslinker |
|---|---|---|---|
| Additive | TMSVE | TMS₃SiVE | DDMSi |
| 9-AntMeOH[1] | X | X | X |
| 9-ABM[2] | ○ | Δ | ○ |

9-ABM was soluble at 1.4 weight percent in all of the vinyl ethers evaluated. In contrast, 9-AM was not soluble in the silicon containing vinyl ethers at half the concentration (0.7 weight percent). At the higher concentration of 9-AM, insolubility was observed for all of the evaluated vinyl ethers with the exception of DGDVE (i.e., diethyleneglycol divinyl ether).

Example 9

In this example, film smoothness was compared for vinyl ether resist formulations with 9-AM (i.e., prior art, 9-anthracenemethanol) or 9-ABM (i.e., anthracenecarboxylic acid-tert-butoxycarbonyl methyl ester) stabilizer. Each vinyl ether resist formulation included a PAG and a stabilizer. The PAG, CGI 1906, concentration was 2.5 wt % of the crosslinker plus diluent weight. The stabilizer, 9-AM or 9-ABM, concentration was 0.7 wt % of the crosslinker plus diluent weight.

The stabilizer, 9-AM or 9-ABM, (3.5 mg) and 12.5 mg of CGI 1906 were dissolved in 0.4 g DGDVE and 0.1 g EHVE to provide the test formulations.

Freshly cleaned silicon substrates were first coated with 1 mL of o-(vinyloxybutyl)-n-(triethoxysilylpropyl)urethane adhesion promoter, placed in a covered basin for 45 seconds, and dried by spinning the wafer at 3,000 rpm for 60 seconds. An AlN$_x$ release layer was sputter deposited onto a quartz substrate and was found to be completely transparent to UV light. The silicon and quartz substrates were then placed in a glove box purged with dry nitrogen. The particular vinyl ether resist formulation was deposited onto the adhesion promoter of the silicon substrate and immediately covered with the quartz substrate such that the release layer was in direct contact with the vinyl ether resist formulation. The assemblies were removed from the glove box and immediately exposed to the filtered output of a 365 nm Hg lamp (Optical Associates, Inc.) at a dose of 220 mJ/cm². Once cured, the quartz substrate was separated from the vinyl ether resist. The morphologies of the cured resists were measured using a Veeco Dimension V scanning Probe Microscope in a tapping mode. The measurement was performed using a 333 kHz cantilever. The surface roughness of the cured film is given in Table 4. Roughness values between the resist formulations with 9-AM or 9-ABM are almost the same, which are acceptable smoothness.

TABLE 4

| Crosslinker | Diluent | Composition (weight ratio) | PAG | Stabilizer | $R_{rms}$ (nm) |
|---|---|---|---|---|---|
| DGDVE | EHVE | 9/1 | CGI1906 | 9-AM | 0.152 |
| | | | | 9-ABM | 0.158 |

Example 10

In this example, adhesion energies of a CoN$_x$ release layer were compared for the typical resist formulations with 9-AM or 9-ABM described above.

The adhesion energies were measured using a DTS Delaminator operated in a double cantilever beam mode. Specimens were prepared using 2 bars, one silicon and one quartz, both 8 mm×65 mm. The quartz bar was coated with the CoN$_x$ release layer by sputtering. The silicon bar was coated with o-(vinyloxybutyl)-n-(triethoxysilylpropyl)urethane (Gelest) as an adhesion promoter. Both bars had a tab epoxied at one end, which was attached to the non-coated side of the bar. The bars were placed in a glove box purged with dry nitrogen. 2-3 microliters of the selected organic vinyl ether resist were dropped onto the adhesion-promoter-coated side of the silicon bar, then immediately covered with the quartz bar such that the CoN$_x$-coated side was in contact with the resist composition. The resist was allowed to spread evenly. The sandwich structure was removed from the glove box and immediately irradiated with output from the OAI mid-UV lamp at a dose of 240 mJ/cm². The CoN$_x$-coated film transmitted about 72% of the UV light. The tabbed ends were fixed into the delaminator grips and debonding measurements commenced immediately after cure. The delaminator was placed in room air at ambient humidity. The delaminator displacement rate was held constant at 2 micron/sec. Data were analyzed to obtain G$_c$ (the critical energy release rate in J/m²), which is a measure of adhesion strength, using conventional beam mechanics well known to those skilled in the art. The results are shown in Table 5.

TABLE 5

| Crosslinker | Diluent | Composition (weight ratio) | PAG | Stabilizer | CoNx Adhesion energy [J/m²] |
|---|---|---|---|---|---|
| DGDVE | EHVE | 9/1 | CGI1906 | 9-AM | 0.318 |
|  |  |  |  | 9-ABM | 0.290 |

The data shows that the resist formulation with 9-AM or 9-ABM when used with the CoN$_x$ release layer has very low fracture energy, which is very desirable for imprint stamp removal.

The flow diagram in FIG. 1 is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

The foregoing description of the embodiments of this invention has been presented for purposes of illustration and description. It is not intended to be exhaustive or to limit the invention to the precise form disclosed, and many modifications and variations are possible. Such modifications and variations that may be apparent to a person skilled in the art are intended to be included within the scope of this invention as defined by the accompanying claims.

What is claimed is:

1. A coating composition, comprising:
   at least one vinyl ether crosslinker having at least two vinyl ether groups;
   at least one diluent comprising a monofunctional vinyl ether compound;
   at least one photoacid generator soluble in a selected one or both of the i) monofunctional vinyl ether compound and ii) the at least one vinyl ether crosslinker; and
   at least one stabilizer comprising an ester compound selectively substituted with a substituent at either i) an ester position or ii) an alpha and the ester positions, wherein the ester compound is of a formula:

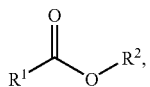

(I)

wherein R¹ represents the substituent at the alpha position, and R² represents the substituent at the ester position, wherein R¹ is a substituted or non-substituted hydrocarbyl substituent, the substituted or non-substituted hydrocarbyl substituent selected from the group consisting of a linear alkyl group, a branched alkyl group, a cycloalkyl group, a bicycloalkyl group, a fluorinated linear alkyl group, a fluorinated branched alkyl group, a fluorinated cycloalkyl group, an aryl group, an aralkyl group, an alkaryl group, an alkenyl group, a cyclo alkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tristrialkysilyl group, a tristriarylsilyl group, a tris-trialkarylsilyl group, a tris-triarakylsilyl group, a tris-triakenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group; and R² is selected from the group consisting of a hydrocarbyl substituent selected from the group consisting of a linear alkyl group, a linear alkoxy group, a linear alkoxycarbonylmethyl group, a branched alkyl group, a branched alkoxy group, a branched alkoxycarbonylmethyl group, a cycloalkyl group, a cycloalkoxy group, a bicycloalkoxy group, a fluorinated linear alkyl group, a fluorinated branched alkyl group, a fluorinated cycloalkyl group, an aryl group, an aralkyl group, an alkaryl group, an alkenyl group, a cyclo alkenyl group, a dihydropyranyl group, a dihydrofuranyl group, an alkalkenyl group, an alkenylalkyl group, an alkynyl group, an alkalkynyl group, an alkynylalkyl group, a trifluormethyl group, a trifluoroethyl group, a trifluoropropyl group, a cyanopropyl group, a tristrialkysilyl group, a tris-triarylsilyl group, a tris-trialkarylsilyl group, a tris-triarakylsilyl group, a tris-triakenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group.

2. The coating composition of claim 1, wherein the substituent at the alpha position is an aliphatic group or an aromatic group.

3. The coating composition of claim 1, wherein the substituent at the ester position is an aliphatic hydrocarbon group or an aromatic hydrocarbon group.

4. The coating composition of claim 1, wherein the substituent at the alpha position is selected from the group consisting of methyl, benzyl, anthracenyl, and napthalenyl.

5. The coating composition of claim 1, wherein the substituent at the ester position is selected from the group consisting of methyl, isopropyl, and tertiary butyl.

6. The coating composition of claim 1, wherein the at least one stabilizer is less than 15% by weight of the photoacid generator.

7. The coating composition of claim 1, wherein the at least one stabilizer is from 0.1 to 5 wt % of the total weight of the vinyl ether crosslinker and diluent components.

8. The coating composition of claim 1, wherein the at least one stabilizer is from 0.2 to 3 wt % of the total weight of the vinyl ether crosslinker and diluent components.

9. The coating composition of claim 1, wherein the at least one stabilizer is selected from the group consisting of anthracenecarboxylic acid methyl ester, anthracenecarboxylic acid isopropyl ester, anthracenecarboxylic acid butyl ester, anthracenecarboxylic acid isopropoxycarbonylmethyl ester, anthracenecarboxylic acid methoxycarbonylmethyl ester, anthracenecarboxylic acid tert-butoxycarbonylmethyl ester, ethyl acetate, isopropyl acetate, tert-butyl acetate, benzoic acid methyl ester, benzoic acid isopropyl ester, benzoic acid tert-butyl ester, and combinations thereof.

10. The coating composition of claim 1, wherein the photoacid generator is non-ionic.

11. The coating composition of claim 1, wherein the at least one vinyl ether crosslinker having at least two vinyl ether groups comprises one of or more of the following structures:

$$C(R^8)(R^9){=}C(R^{10})OC(R^{11})(R^{12})[C(R^{13})(R^{14})]_nC(R^{15})(R^{16})OC(R^{17}){=}C(R^{18})(R^{19}) \quad (III),$$

$$C(R^{20})(R^{21}){=}C(R^{22})OC(R^{23})(R^{24})[(C(R^{25})(R^{26}))_pO(C(R^{27})(R^{28}))_q]_rC(R^{29})(R^{30})OC(R^{31}){=}C(R^{32})(R^{33}) \quad (IV),$$

and $$[C(R^{34})(R^{35}){=}C(R^{36})OC(R^{37})(R^{38})[C(R^{39})(R^{40})]_s[(C(R^{41})(R^{42}))_tO(C(R^{43})(R^{44}))_u]_v]_w[A] \quad (V)$$

wherein each n is represented by an integer from 1 to 10, each p is represented by an integer from 1 to 10, each q is represented by an integer from 1 to 10, each r is represented by an integer from 1 to 10, each s is represented by an integer from 0 to 10, each t is represented by an integer from 1 to 10, each u is represented by an integer from 1 to 10, each v is represented by an integer from 0 to 10, and each w is represented by an integer from 3 to 6, wherein each $R^8, R^9, R^{10}, R^{11}, R^{12}, R^{13}, R^{14}, R^{15}, R^{16}, R^{17}, R^{18}, R^{19}, R^{20}, R^{21}, R^{22}, R^{23}, R^{24}, R^{25}, R^{26}, R^{27}, R^{28}, R^{29}, R^{30}, R^{31}, R^{32}, R^{33}, R^{34}, R^{35}, R^{36}, R^{37}, R^{38}, R^{39}, R^{40}, R^{41}, R^{42}, R^{43}$, and $R^{44}$ may be independently at each occurrence a hydrogen atom, a substituted hydrocarbyl substituent, or a non-substituted hydrocarbyl substituent, and wherein the A group is an aromatic group.

12. The coating composition of claim 11, wherein the substituted or non-substituted hydrocarbyl substituent is selected from the group consisting of a linear alkyl group having 1-6 carbon atoms, a linear alkoxy group having 1-6 carbon atoms, a branched alkyl group having 2-12 carbon atoms, a branched alkoxy group having 2-12 carbon atoms, a cycloalkyl, a bicycloalkyl, a cycloalkoxy having 3-17 carbon atoms, a bicycloalkoxy group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, and a cyanopropyl group.

13. The coating composition of claim 1, wherein the at least one diluent comprising a mono functional vinyl ether compound is represented by the following structure:

$$C(R^3)(R^4){=}C(R^5)O(C(R^6)(R^7))_m,$$

wherein m is an integer from 1 to 20, and wherein each $R^3, R^4, R^5, R^6$, and $R^7$ is independently at each occurrence a hydrogen atom or a substituted or non-substituted hydrocarbyl substituent.

14. The coating composition of claim 13, wherein the substituted or non-substituted hydrocarbyl substituent is selected from the group consisting of a linear alkyl group having 1-6 carbon atoms, a linear alkoxy group having 1-6 carbon atoms, a branched alkyl group having 2-12 carbon atoms, a branched alkoxy group having 2-12 carbon atoms, a cycloalkyl, a bicycloalkyl, a cycloalkoxy having 3-17 carbon atoms, a bicycloalkoxy group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, and a cyanopropyl group.

15. The coating composition of claim 1, wherein the least one mono functional vinyl ether compound and the at least one vinyl ether crosslinker are free from silicon and fluorine substituents.

16. A coating composition, comprising:
at least one vinyl ether crosslinker having at least two vinyl ether groups;
at least one diluent comprising a monofunctional vinyl ether compound;
at least one photoacid generator soluble in a selected one or both of the i) monofunctional vinyl ether compound and ii) the at least one vinyl ether crosslinker; and
at least one stabilizer comprising an ester compound selectively substituted with a substituent at either i) an ester position or ii) an alpha and the ester positions, wherein the ester compound is of a formula:

(I)

wherein $R^1$ represents the substituent at the alpha position, and $R^2$ represents the substituent at the ester position, wherein the $R^1$ substituent is selected from the group consisting of methyl, benzyl, anthracenyl, and napthalenyl wherein the $R^2$ substituent at the ester position is selected from the group consisting of methyl, isopropyl, and tertiary butyl.

17. A coating composition, comprising:
at least one vinyl ether crosslinker having at least two vinyl ether groups;
at least one diluent comprising a monofunctional vinyl ether compound;
at least one photoacid generator soluble in a selected one or both of the i) monofunctional vinyl ether compound and ii) the at least one vinyl ether crosslinker; and
at least one stabilizer comprising an ester compound selectively substituted with a substituent at either i) an ester position or ii) an alpha and the ester positions, wherein the ester compound is of a formula:

(I)

wherein $R^1$ represents the substituent at the alpha position, and $R^2$ represents the substituent at the ester position, wherein the $R^1$ substituent is selected from the group consisting of methyl, benzyl, anthracenyl, and napthalenyl wherein the $R^2$ substituent at the ester position is selected from the group consisting of methyl, isopropyl, and tertiary butyl, and wherein the at least one stabilizer is less than 15% by weight of the photoacid generator.

18. A coating composition, comprising:
at least one vinyl ether crosslinker having at least two vinyl ether groups;
at least one diluent comprising a monofunctional vinyl ether compound;
at least one photoacid generator soluble in a selected one or both of the i) monofunctional vinyl ether compound and ii) the at least one vinyl ether crosslinker; and
at least one stabilizer selected from the group consisting of anthracenecarboxylic acid methyl ester, anthracenecarboxylic acid isopropyl ester, anthracenecarboxylic acid butyl ester, anthracenecarboxylic acid isopropoxycarbonylmethyl ester, anthracenecarboxylic acid methoxycarbonylmethyl ester, anthracenecarboxylic acid tert-butoxycarbonylmethyl ester, ethyl acetate, isopropyl acetate, tert-butyl acetate, benzoic acid methyl ester, benzoic acid isopropyl ester, benzoic acid tert-butyl ester, and combinations thereof.

19. A coating composition, comprising:
at least one vinyl ether crosslinker having at least two vinyl ether groups;
at least one diluent comprising a monofunctional vinyl ether compound;
at least one photoacid generator soluble in a selected one or both of the i) monofunctional vinyl ether compound and ii) the at least one vinyl ether crosslinker; and
at least one stabilizer comprising an ester compound selectively substituted with a substituent at either i) an ester position or ii) an alpha and the ester positions, wherein the ester compound is of a formula:

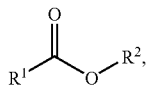

(I)

wherein $R^1$ represents the substituent at the alpha position, and $R^2$ represents the substituent at the ester position, wherein the $R^1$ substituent is selected from the group consisting of methyl, benzyl, anthracenyl, and napthalenyl wherein the $R^2$ substituent at the ester position is selected from the group consisting of methyl, isopropyl, and tertiary butyl, and wherein the photoacid generator is non-ionic.

20. An imprint process, comprising:
coating a substrate with an vinyl ether resist formulation comprising at least one vinyl ether crosslinker having at least two vinyl ether groups; at least one diluent comprising a monofunctional vinyl ether compound; at least one photoacid generator soluble in a selected one or both of the i) monofunctional vinyl ether compound and ii) the at least one vinyl ether crosslinker; and at least one stabilizer comprising an ester compound selectively substituted with a substituent at either i) an ester position or ii) an alpha and the ester positions, wherein the ester compound is of a formula:

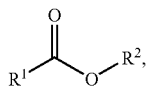

(I)

wherein $R^1$ represents the substituent at the alpha position, and $R^2$ represents the substituent at the ester position, wherein $R^1$ is a substituted or non-substituted hydrocarbyl substituent, the substituted or non-substituted hydrocarbyl substituent selected from the group consisting of a linear alkyl group, a branched alkyl group, a cycloalkyl group, a bicycloalkyl group, a fluorinated linear alkyl group, a fluorinated branched alkyl group, a fluorinated cycloalkyl group, an aryl group, an aralkyl group, an alkaryl group, an alkenyl group, a cyclo alkenyl group, a dihydropyranyl group, a dihydrofuranyl group, an alkalkenyl group, an alkenylalkyl group, an alkenyl group, an alkalkynyl group, an alkynylalkyl group, a trifluoromethyl group, a trifluoroethyl group, a trifluoropropyl group, a cyanopropyl group, a tristrialkysilyl group, a tris-triarylsilyl group, a tris-trialkarylsilyl group, a tris-triarakylsilyl group, a tris-triakenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group; and $R^2$ is selected from the group consisting of a hydrocarbyl substituent selected from the group consisting of a linear alkyl group, a linear alkoxy group, a linear alkoxycarbonylmethyl group, a branched alkyl group, a branched alkoxy group, a branched alkoxycarbonylmethyl group, a cycloalkyl group, a cycloalkoxy group, a bicycloalkoxy group, a fluorinated linear alkyl group, a fluorinated branched alkyl group, a fluorinated cycloalkyl group, an aryl group, an aralkyl group, an alkaryl group, an alkenyl group, a cyclo alkenyl group, a dihydropyranyl group, a dihydrofuranyl group, an alkalkenyl group, an alkenylalkyl group, an alkenyl group, an alkalkynyl group, an alkynylalkyl group, a trifluormethyl group, a trifluoroethyl group, a trifluoropropyl group, a cyanopropyl group, a tristrialkysilyl group, a tris-triarylsilyl group, a tris-trialkarylsilyl group, a tris-triarakylsilyl group, a tris-triakenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group;
pressing a template having a relief image onto the vinyl ether resist formulation;
photocationically curing the vinyl ether resist formulation to form a solidified reverse image replica of the relief pattern in the template; and
releasing the template from the cured organic vinyl ether resist formulation.

21. The imprint process of claim 20, wherein the at least one stabilizer is from 0.2 to 6 wt % of the total weight of the vinyl ether crosslinker and diluent components.

22. The imprint process of claim 20, wherein the at least one stabilizer is selected from the group consisting of anthracenecarboxylic acid methyl ester, anthracenecarboxylic acid isopropyl ester, anthracenecarboxylic acid butyl ester, anthracenecarboxylic acid isopropoxycarbonylmethyl ester, anthracenecarboxylic acid methoxycarbonylmethyl ester, anthracenecarboxylic acid tert-butoxycarbonylmethyl ester, ethyl acetate, isopropyl acetate, tert-butyl acetate, benzoic acid methyl ester, benzoic acid isopropyl ester, benzoic acid tert-butyl ester, and combinations thereof.

23. The imprint process of claim 20, wherein photocationically curing the vinyl ether resist formulation comprises exposing the vinyl ether resist formulation to ultraviolet radiation for a period of time and energy effective to solidify the vinyl ether resist formulation.

24. The imprint process of claim 20, wherein the viscosity is less than or equal to 15 centipoise at 295 Kelvin.

* * * * *